(12) United States Patent
Shim et al.

(10) Patent No.: US 6,752,874 B2
(45) Date of Patent: Jun. 22, 2004

(54) APPARATUS FOR PERPENDICULAR-TYPE ULTRA VACUUM CHEMICAL VAPOR DEPOSITION

(75) Inventors: Kyu-Hwan Shim, Taejon (KR); Hong-Seung Kim, Taejon (KR); Seung-Yun Lee, Taejon (KR); Jin-Yeoung Kang, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 77 days.

(21) Appl. No.: 09/789,890

(22) Filed: Feb. 20, 2001

(65) Prior Publication Data

US 2002/0056414 A1 May 16, 2002

(30) Foreign Application Priority Data

Oct. 12, 2000 (KR) ........................................ 2000-60004

(51) Int. Cl.⁷ ..................... C23C 16/000; H01L 21/000
(52) U.S. Cl. .................... 118/719; 118/715; 118/725
(58) Field of Search ................................ 118/715, 719

(56) References Cited

U.S. PATENT DOCUMENTS

| | | | | | |
|---|---|---|---|---|---|
| 3,717,439 | A | * | 2/1973 | Sakai | 118/715 |
| 4,674,434 | A | * | 6/1987 | Ishihara | 118/50.1 |
| 4,849,608 | A | * | 7/1989 | Muraoka et al. | 219/390 |
| 4,962,726 | A | * | 10/1990 | Matsushita et al. | 118/719 |
| 5,016,567 | A | * | 5/1991 | Iwabuchi et al. | 118/733 |
| 5,058,526 | A | * | 10/1991 | Matsushita et al. | 118/715 |
| 5,120,394 | A | | 6/1992 | Mukai | |
| 5,207,573 | A | * | 5/1993 | Miyagi et al. | 432/152 |

(List continued on next page.)

FOREIGN PATENT DOCUMENTS

EP 574935 A1 * 12/1993 ........... H01L/21/00

OTHER PUBLICATIONS

Growth of epitaxial germanium–silicon heterostructures by chemical vapour deposition by D.W. Greve; Materials Science and Engineering; pp. 22–48.

Silicon homoepitaxy by Raid Thermal Processing Chemical Vapor Deposition (RTPCVD) by T.Y. Hsieh et al. J. Electrochem. Soc., vol. 138, No. 4, Apr. 1991.

Selective epitaxial growth of Si . . . strained layers in a tubular hot–wall low pressure . . . ; by Wei–Chung Wang et al.; J. Vac. Sci. Technol. B Jan./Feb. 1997 pp. 138–141.

Si/SiGe Epitaxial–Base Transistors–Part I: Materials, Physics, and Circuits; by D.L. Harame et al. 1995 IEEE Transactions on Electrons Devices, vol. 42, No. 3, Mar. 1995.

Si/SiGe Epitaxial–Base Transistors–Part II: Process Integration and Analog Applications; by D.L. Harame et al.IEEE Transactions on Electrons Devices, vol. 42, No. 3, Mar. 1995.

*Primary Examiner*—Parviz Hassanzadeh
*Assistant Examiner*—Karla Moore
(74) *Attorney, Agent, or Firm*—Blakely, Sokoloff, Taylor & Zafman

(57) ABSTRACT

The apparatus for a perpendicular type ultra vacuum chemical vapor deposition, which is for growing an epitaxy crystal as a semiconductor thin film based on a high quality, includes a growth chamber having a quartz tube of a heterostructure for maintaining a uniformity in a growth of an epitaxial layer under a high vacuum and minimizing a thermal transfer from a wafer; a wafer transferring chamber having a perpendicular transfer device for vertically transferring the wafer on which the epitaxial layer grows; a buffer chamber for preventing a stress to a transfer gear caused by a pressure difference with the wafer transferring chamber in vertically transferring the wafer; and a loadlock chamber for reducing a pollution from the outside in the growth of the epitaxial layer, horizontally transferring the wafer completed in the growth of the epitaxial layer, and discharging it to the outside.

13 Claims, 7 Drawing Sheets

U.S. PATENT DOCUMENTS

| | | | |
|---|---|---|---|
| 5,298,452 A | | 3/1994 | Meyerson |
| 5,316,472 A | * | 5/1994 | Niino et al. ............... 432/241 |
| 5,443,648 A | * | 8/1995 | Ohkase ..................... 118/724 |
| 5,536,919 A | * | 7/1996 | Taheri ....................... 219/402 |
| 5,571,330 A | * | 11/1996 | Kyogoku ................... 118/719 |
| 5,589,421 A | * | 12/1996 | Miyashita et al. .......... 437/225 |
| 5,622,639 A | * | 4/1997 | Kitayama et al. ........... 219/390 |
| 6,183,564 B1 | * | 2/2001 | Reynolds et al. ........... 118/719 |
| 6,190,460 B1 | * | 2/2001 | Hwang ...................... 118/729 |
| 6,214,410 B1 | * | 4/2001 | Stirniman et al. .......... 427/131 |
| 6,245,147 B1 | * | 6/2001 | Kobayashi ................. 118/500 |

* cited by examiner

APPARATUS FOR PERPENDICULAR-TYPE ULTRA VACUUM CHEMICAL VAPOR DEPOSITION

FIELD OF THE INVENTION

The present invention relates to a semiconductor fabrication; and, more particularly, to an apparatus for an ultra vacuum chemical vapor deposition and an epitaxial layer growing method therefor, in which a single crystal semiconductor thin film based on a high quality can be prominently grown in a manufacturing nature.

PRIOR ART OF THE INVENTION

In a complementary metal oxide semiconductor (CMOS) technique, it has been recently further developed a device based on a minimum of feature of 0.13 $\mu$m and a memory capacity of 1 giga (G). By such consecutive technique development, it is anticipated to embody the minimum of feature of 0.035 $\mu$m and an integration degree of $10^{10}$ cm$^{-2}$ in 2012. Further, it is being diversely progressed an endeavor to embody a system-on-chip by improving a function of the CMOS, to thus promote an actual use for a BiCMOS having an addition of SiGe HBT.

However, there is a limitation in reducing the integration degree of the device by using a capability of controlling a reproducibility and a uniformity in a conventional semiconductor manufacturing technique, therefore, it is needed a development for a next-generation semiconductor technique to overcome such limitation. Particularly, in a growth technique of a semiconductor epitaxial layer, most fundamental and decidable method is provided to overcome such limitations.

In the growth technique of the conventional epitaxial layer, there are a gas-source molecular beam epitaxy (GSMBE) method, a rapid thermal chemical vapor deposition (RTCVD) method, a low pressure chemical vapor deposition (LPCVD) method, and a horizontal type ultra high vacuum vapor deposition (UHV-CVD) etc.

The gas source molecular beam epitaxy (hereinafter, referred to as "GSMBE") using a gas source has been being used most frequently in a research institute, and this technique provides a growth characteristic of an epitaxial layer prominent in an interfacial abruptness under a pressure of 600° C. and 1.4×10$^{-4}$ Torr. But, the GSMBE is unstable in using the source, causes a ge-segregation of germanium, makes a cost and usage expenses high, and has a low throughput thus its productivity is shortage, therefore there is a limitation that it is difficult to be applied to a producing technique.

The RTCVD of FIG. 1 in a conventional another technique relates to a viscous laminar flow, in other words, is valid to perform a growth under a pressure of 6 Torr, and has a growth function by maintaining the flow with hydrogen gas in a cold-wall reactor 3 having an installment of a single wafer 1 and a cooling plate 2, and matches temperature and changes reaction gas. Thereby, the RTCVD has a growth function. That is, a growth process is simple and its usage is various, but reproducibility important in a growth of the epitaxial layer rapidly performing a temperature control is insufficient therein, and it is not open used owing to a shortcoming of representing a loading efficiency.

Subsequently, as shown in FIG. 2, the LPCVD controls a leak rate as 1 mTorr/min and controls a growth rate as 0.4~4 nm/min. Since this LPCVD is a low pressure, it is convenient to manufacture or use the device, thus this device has been used most much in order for a polycrystal thin film of silicon or a vapor deposition of an insulation film such as an oxide film or a nitride film. However, it is lack in a function of cutting off oxide or moisture injected from the neighborhood of a chamber 3. In other words, in order to deposit a thin film based on a high purity, it is needed to execute a purge with hydrogen gas for a long time, and an epitaxial layer based on a lower quality is grown in comparison with the technique obtaining the growth in a high-vacuum chamber. Herewith, an unexplained reference number '2' indicates the cooling plate.

The horizontal type UHV-CVD shown in FIG. 3 is for an apparatus and method for growing a single-crystal silicon epitaxy by several sheets in an isothermal chamber 4 of a how wall, and has growth temperature below 800° C., and restricts a growth rate by non-plain power. By the silicon gas within the isothermal chamber, a uniform growth of an epitaxial layer is gained on a wafer 1 of several sheets, and an ultra-high vacuum of 10$^{-10}$ torr is supported before a start of the growth, and the silicon epitaxial layer is defined as a very keen region at the moment when the silicon epitaxial layer grows. Therefore, the epitaxial layer under 500 defects per a unit area cm$^2$ can grow. Such horizontal type ultra-high vacuum growing device is simple in its manufacture since the wafer can be transferred horizontally, but there is a serious shortcoming of accumulating the vapor deposition in the growth chamber and of a systematic footprint.

It is anticipated that the Moore laws will become relieved in an aspect of incline from a start point of about 2010 year provided under about 100 nm, since an added value of the integration reaches some limitation. Also, according that a structure and a function not used at the past are strengthened in the silicon semiconductor, the integration is gained in a radio frequency (RF) functional device or an optical functional device, to thus obtain the system-on-chip and remarkably heighten a cost and a performance of a semiconductor chip. In its concerning problems, a management for electric power through a low power operation and a curtailment for a manufacturing cost of the semiconductor etc. are proposed, and it will be mainly provided a research to overcome such technical difficulties as a development of a process technique through a development start of a device structure under 100 nm in the minimum of feature from around 2003 year, a new physical field for a quantization effect and an uncertain current flow, an excessive electricity consumption, a complication of a design and a tunneling.

For instances, in a modulation FET (MODFET), a characteristic of a high-speed operation is improved by generally heightening a movement extent of a transferor, leakage current is small, and a nonlinear operation characteristic caused in a single channel is improved, therefore there were much research. However, in a case of SiGe-MODFET, there still is a serious problem in a commercial use thereof.

An application of SiGe semiconductor was initially proposed by Herbert Kroemer in 1957, and SiGe low-temperature growth applicable to a device was initially proposed by Meyerson of IBM in 1981. But, an actually operating SiGe HBT was published by Meyerson in 1987 by completely satisfying a characteristic of the device through a growth of the epitaxial layer. According to such technical advance, a research for the SiGe was rapidly increased. SiGe-HBT $f_t$=75 GHz (IBM) is published in 1990, SiGe BICMOS in 1992, and SiGe-HBT $f_t$=100 GHz in 1994, through a renewal of a record in order. Also the IBM announced a commercial use of SiGe HBT on 8-inch wafers in 1994. In 1998, not only the IBM but also several companies such as TEMIC, SGS Thompson, and Maxim etc. had initially provided an LNA, a Mixer, a power amplifier, and a VCO etc.

The most important one to realize the device of SiGe and improve it with a prominent characteristic was depended upon a technical achievement in the SiGe epitaxial layer growth. A grid discordance between Si and Ge is severe as 4.2%, thus there is a limitation in its usage, since a threshold thickness is 80~100 nm when $X_{Ge}$ is 8~12% and the threshold thickness is 40~50 nm when $X_{Ge}$ is 16~24%. Further, when a growth condition is not appropriate, a thermal shock is provided, or an impurity substance exists on the surface of a wafer, a large amount of defect is caused easily. In a merit point in using the SiGe, the SiGe layer receives a pressure stress to degenerate a band and thus heighten a movement degree of a transferor, it is applicable to a light receiving element by controlling energy gap energy Eg by 0.66~1.12 eV, and a band gap discordance mainly exists on a valence band in an n-p-n structure of a bipolar element to thereby make a movement of electron easy and heighten an efficiency by reducing a hole injected from a base to an emitter, etc.

In checking the growth technique of the SiGe epitaxy, a composition of Ge should uniformly grow within 5%, a consistency of C and O as impurity substances injected from an interfacial neighborhood should be small, and there should exist a control capability of a doping consistency keen enough to be several numbers of atomic layers. Herewith, also, a performance similar to a general process technique for a growth provided through a disposition of several sheets should be provided, a thermal stableness should be ensured without a problem such as a relaxation of stress or a defect occurrence of a thin film caused on the neighborhood of 600° C., and a problem such as leak current between a collector and a base should be eliminated by an epitaxy based on a low defect, namely, a high yield and low expenses. Furthermore, properties of matter based on a high quality should be maintained even after a furnace anneal of 850° C. or a rapid thermal anneal of 900~1000° C.

A function of a low temperature growth is much required, which is why the growth should be performed below 650° C. because of problems such as a interfacial diffusion of SiGe/Si and a diffusion of B, and a defect occurrence caused by a stress relaxation of a metastable SiGe layer should be prevented. As problems in the growth of low temperature, a crystal defect becomes contained because a surface diffusion of Si is not sufficient, or an in-situ cleaning of a natural oxide film is inefficient, or a growth rate is low, or n-type and p-type doping based on a high consistency are difficult in the in-situ, or a guarantee for a reliability and a stableness for a long period is difficult.

A growth apparatus requiring a growth of a high vacuum in order to settle the above-mentioned restriction conditions is controlled by a molecular flow below $10^{-3}$ torr pressure, controls a vapor reaction, and is valid to get a proper combination with a growth provided by a surface reaction control of the low temperature. Especially, an ultra-vacuum growth provides a growth of an epitaxial layer based on a high quality in the low temperature, and also has a small loading effect, and minimizes an injection of defect/impurity, and is also very profitable to a selective epitaxy growth (SEG).

In such high vacuum growth, a growth chamber should be under 10 ppb in moisture and oxide content, and in order to predict a consistency of impurity as oxide injected according to an epitaxy growth condition, in a case of the growth condition such as roughly pressure P=10 Torr, M=32 amu, and temperature T=300 K, a quantity of reactive gas reaching a unit surface of the wafer is as follows:

Numeric Expression 1

$$Z_A = 2.63 \times 10^{22} \frac{P}{\sqrt{MT}} \ (cm^{-2}s^{-1})$$

It can be noted that its value becomes $Z_A$=3.6×10$^{21}$ cm$^{-2}$ s$^{-1}$. Also, even though the growth rate is 1 nm/s and a sticking coefficient of impurity gas atom is very low as 0.01, in case that a grown pressure is 10$^{-3}$ Torr and 10 Torr and there exists the impurity gas of 100 ppb, the amount of the impurity injected in the epitaxy is 4×10$^{15}$ cm$^{-3}$ and 5×10$^{18}$ cm$^{-3}$, there is much difference therebetween. Such injection of the impurity is also increased by 10 times under 100 ppb.

In the chemical vapor deposition apparatus it can occur very easily the impurity gas of 1000 ppb according that how the growth chamber is designed and used.

In the growth of the SiGe and Si epitaxy, the low-temperature growth is being highlighted as technique useful in a manufacture of a device having a surface rapid and small in size. Particularly, the high-consistency phosphorus doping n$^+$-silicon epitaxy based on the low temperature is definitely needed to manufacture an Si/SiGe heterostructure device such as MODFET(Modulation-Doped FET), MOS-FET (Metal-Oxide-Semiconductor FET), and HBT (Heterojunction Bipolar Transistor).

In executing the chemical vapor deposition (CVD), it has been mainly used phosphine or arsine as n-type dopant.

The low-temperature growth of the high-consistency n$^+$-silicon layer is being actively researched to apply it to the SiGe heterostructure or a small-sized device of a nanometer unit. Especially, it is known that an impurity diffusion, an intermixing of Si/Si$_{1-x}$Ge$_x$ interface and a stress relaxation etc. occur over a constant temperature, to have a harmful influence on a performance of the device. Meantime, a systematic research for the low temperature growth of silicon related to the n-type dopant injection is scarcely executed. To execute the low temperature growth of the n-type silicon epitaxy, it is essentially needed a technique for removing the natural oxide film existing on the substrate in rather low temperature. At present, a real time (in situ) hydrogen thermal anneal for removing the natural oxide film must be performed for several minutes under temperature of 900° C. in order to remove the natural oxide film, by the time, in manufacturing the device, it can not be executed a high-temperature hydrogen thermal anneal process to eliminate the natural oxide material after performing a vapor deposition for the SiGe layer. Therefore, it has been regarded, as an alternative method, a method of etching the surface within reactive gas such as HF, HCl and methanol or their mixture etc. However, the reactive gas causes an unequal pin hole on the surface thereof or corrodes an oxide film mast layer. Thus, it is required a technique for forming the silicon epitaxial layer based on a good quality without a high-temperature thermal anneal process.

SUMMARY OF THE INVENTION

Therefore, it is an object of the present invention to provide an apparatus for a perpendicular-type ultra vacuum chemical vapor deposition, in which a thin film based on a high quality can grow under low pressure and low temperature of 10$^{-3}$ Torr and 500° C. by disposing wafers by 50 pieces or over at one time, thereby obtaining a sufficient throughput by the equipment for a production.

Another object of the present invention is to provide an apparatus for a perpendicular-type ultra vacuum chemical vapor deposition appropriate to that a growth to an atomic unit under low temperature is gained, impurity based on a high consistency is doped in a two dimension, or a 2 DEG quantization effect device is manufactured, by reducing contents of oxygen or carbon to a basic vacuum of $1 \times 10^{-9}$ Torr.

A still another object of the present invention is to provided an apparatus for a perpendicular-type ultra vacuum chemical vapor deposition, in which a defect extent can be lowered and a width of a doping consistency can be controlled so as to become narrow and keen on a wafer having a pattern by controlling an exact thickness, composition and consistency.

A further object of the present invention is to provide an apparatus for a perpendicular-type ultra vacuum chemical vapor deposition, which is capable of cutting off a flow of current provided by an inversion of a silicon cap layer Si-Cap in a general SiGe-MODFET, preventing a flow of leak current caused by a precipitation of Ge generated in forming an oxide film, and preventing a diffusion in high temperature when performing an epitaxial layer growth or a manufacture process.

To achieve these and other advantages, and in accordance with the purpose of the present invention, an apparatus for a perpendicular-type ultra vacuum chemical vapor deposition comprises a growth chamber having a quartz tube of a heterostructure for maintaining a uniformity of an epitaxy growth under a high vacuum and minimizing a thermal transfer from a wafer; a wafer transferring chamber connected to a lower side of the growth chamber, the wafer transferring chamber having a perpendicular transfer device for vertically transferring the wafer on which the epitaxy grows; a buffer chamber equipped in a lower side of the wafer transferring chamber, for preventing a stress to a transfer gear caused by a pressure difference with the wafer transferring chamber in vertically transferring the wafer; and a loadlock chamber connected to one side of the wafer transferring chamber, for reducing a pollution from the outside in a growth of the epitaxy, horizontally transferring the wafer completed in the growth of the epitaxy, and discharging it to the outside: wherein the quartz tube of the heterostructure includes an inner quartz tube having a support flange in a lower part thereof, the inner quartz tube being opened in a lower end part thereof; an outer quartz tube supported to the support flange of the inner quartz tube with a constant interval from the inner quartz tube, the outer quartz tube having a support flange in a lower part thereof and being opened in a lower end part thereof; a cooling water tube equipped in an outer side of the support flange of the outer quartz tube, for preventing a hear transfer transferred to the outer quartz tube; a thermocouple equipped along one side inner circumference face of the inner quartz tube and a gas injecting part equipped along another side inner circumference face of the inner quartz tube; and a vacuum port for providing vacuum by opening one side face of one side support flange of the outer quartz tube, the thermocouple and the gas injecting part being connected to the support flange of the inner quartz tube with a lower end part thereof, and a center part of the support flange of the inner quartz tube having a formation of an opening aperture provided as an inlet and an outlet for loading and unloading the wafer: and wherein the perpendicular transfer device within the wafer transferring chamber includes an upper flange opened in a center thereof, for separating the growth chamber and the wafer transferring chamber during a growth of the epitaxy; a wafer carrier accepting numerous wafers and supported thereby; a quartz bottom plate for supporting the wafer carrier; a wafer transfer die connected to the quartz bottom plate, for supporting the wafer carrier on which the wafers are accumulated, and vertically moving it; a lower flange stuck to the buffer chamber and opened in a center thereof; a primary convey die having a primary transfer gear and an outer bellows connected between one side of the upper flange and the buffer chamber, the outer bellows for upwards moving the upper flange; and a secondary convey die which has a secondary transfer gear connected to the wafer transfer die and has an inner bellows connected between the upper flange and the secondary transfer gear so as to position the wafer carrier vertically transferred by the primary convey die at a uniform temperature region of the growth chamber, the inner bellows being moved upwards by a rotation of the secondary transfer gear.

BRIEF DESCRIPTION OF THE DRAWINGS

The above and other objects and features of the instant invention will become apparent from the following description of preferred embodiments taken in conjunction with the accompanying drawings, in which.

PREFERRED EMBODIMENT OF THE INVENTION

Hereinafter, preferred embodiments of the present invention will be described in detail with reference to the accompanying drawings.

Figure 1:
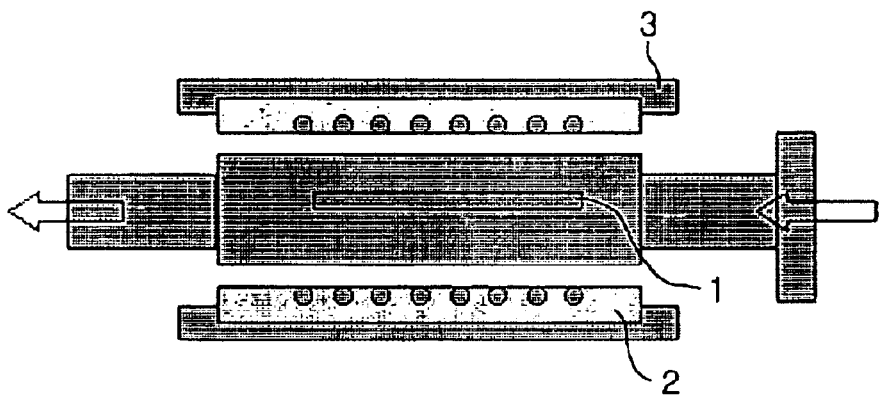
FIG. 1 represents a diagram showing a conventional apparatus for a rapid thermal chemical vapor deposition.
Figure 2:
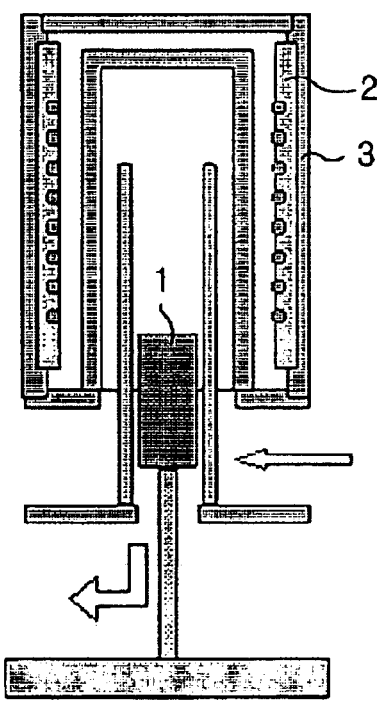
FIG. 2 presents a diagram showing a conventional apparatus for a low pressure chemical vapor deposition.
Figure 3:
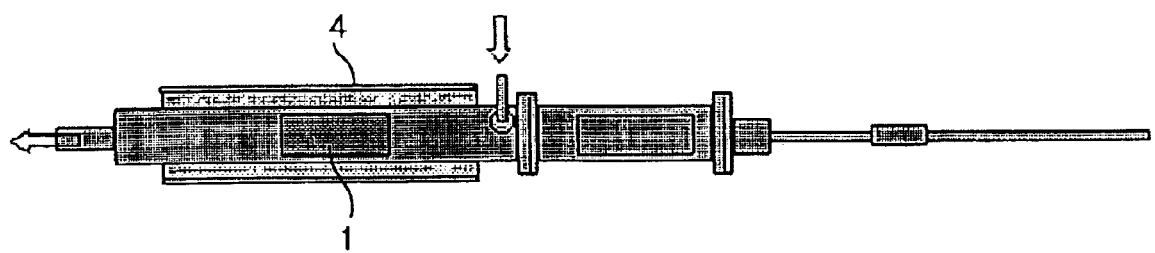
FIG. 3 depicts a diagram showing a conventional apparatus for an ultra vacuum chemical vapor deposition.
Figure 4:
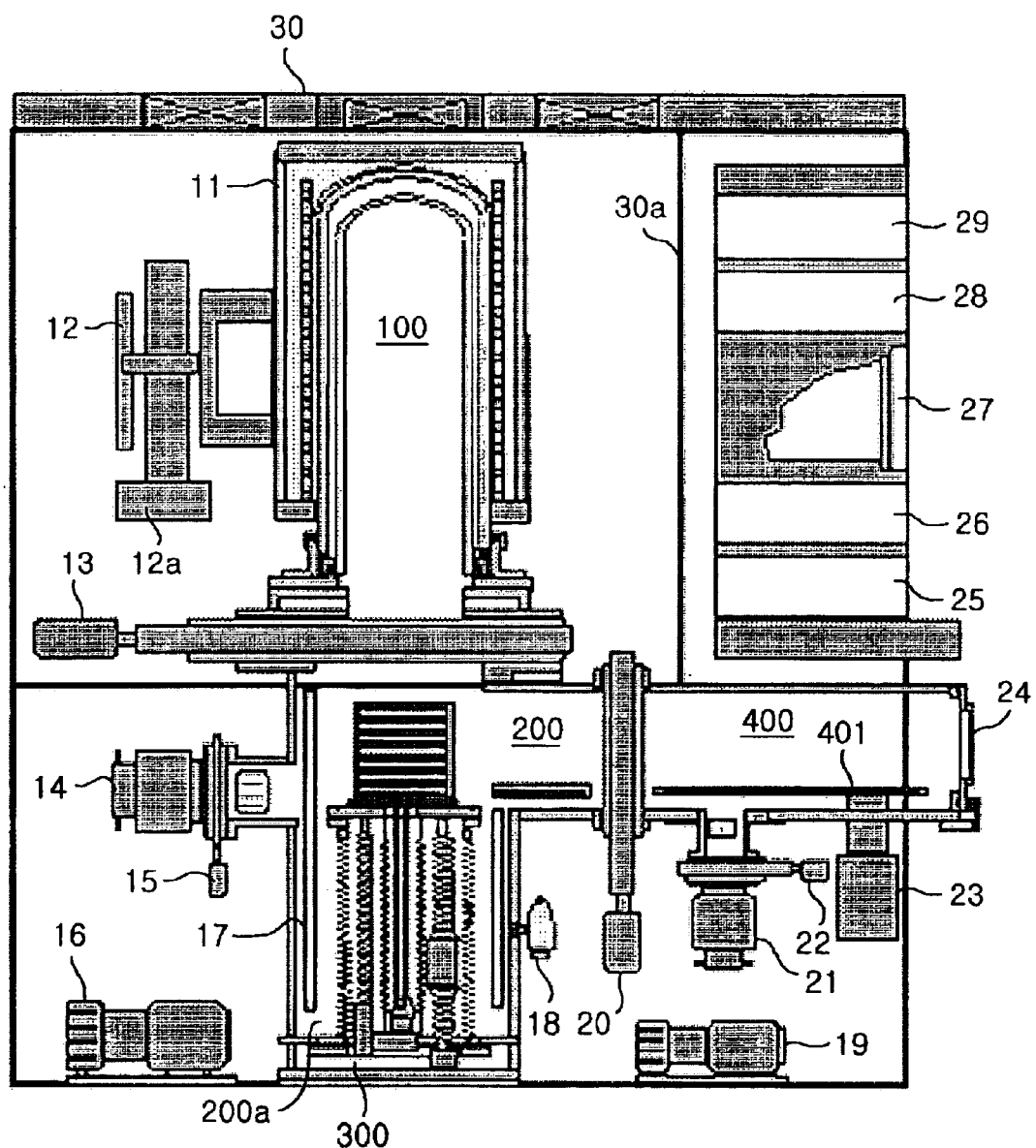
FIG. 4 is a side view showing an apparatus for a perpendicular type ultra vacuum chemical vapor deposition in accordance with the present invention.
Figure 5:
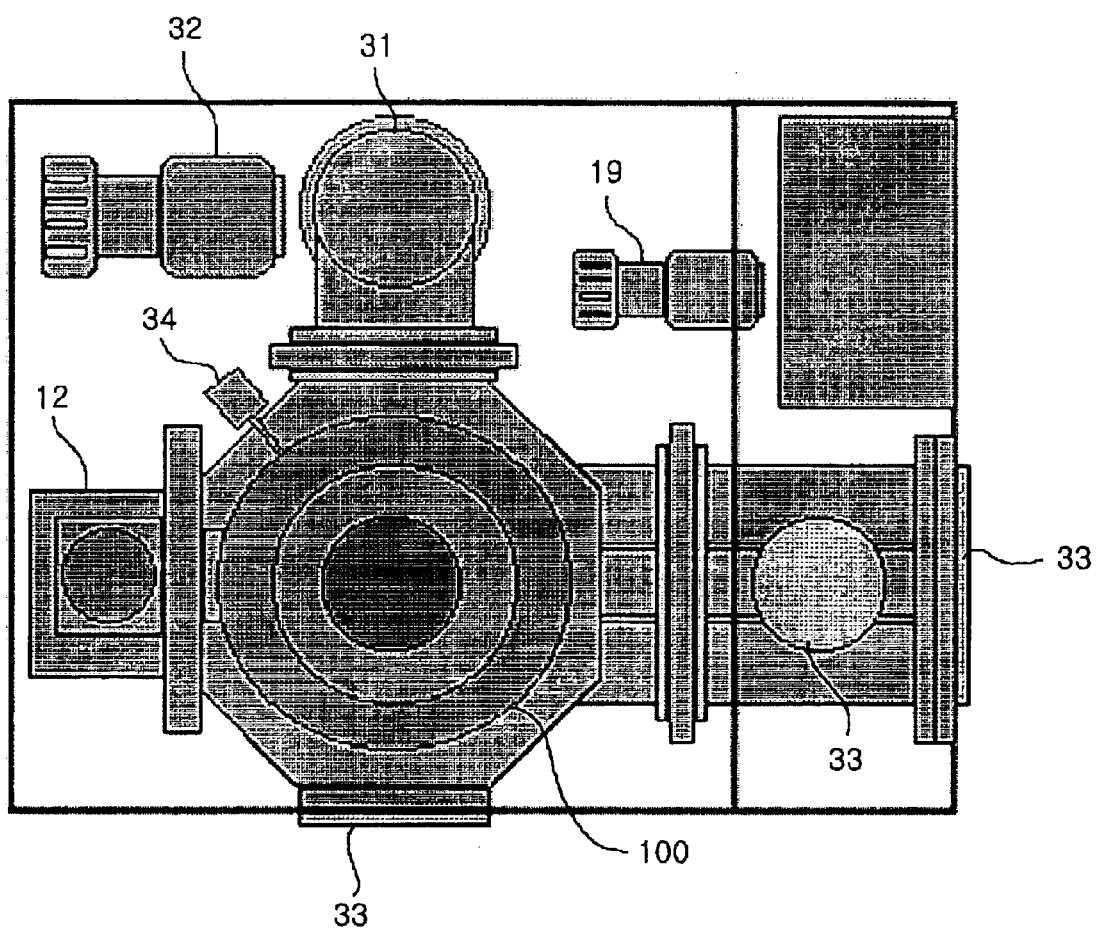
FIG. 5 illustrates an upper face view providing an apparatus for a perpendicular type ultra vacuum chemical vapor deposition in accordance with the present invention.
Figure 6:
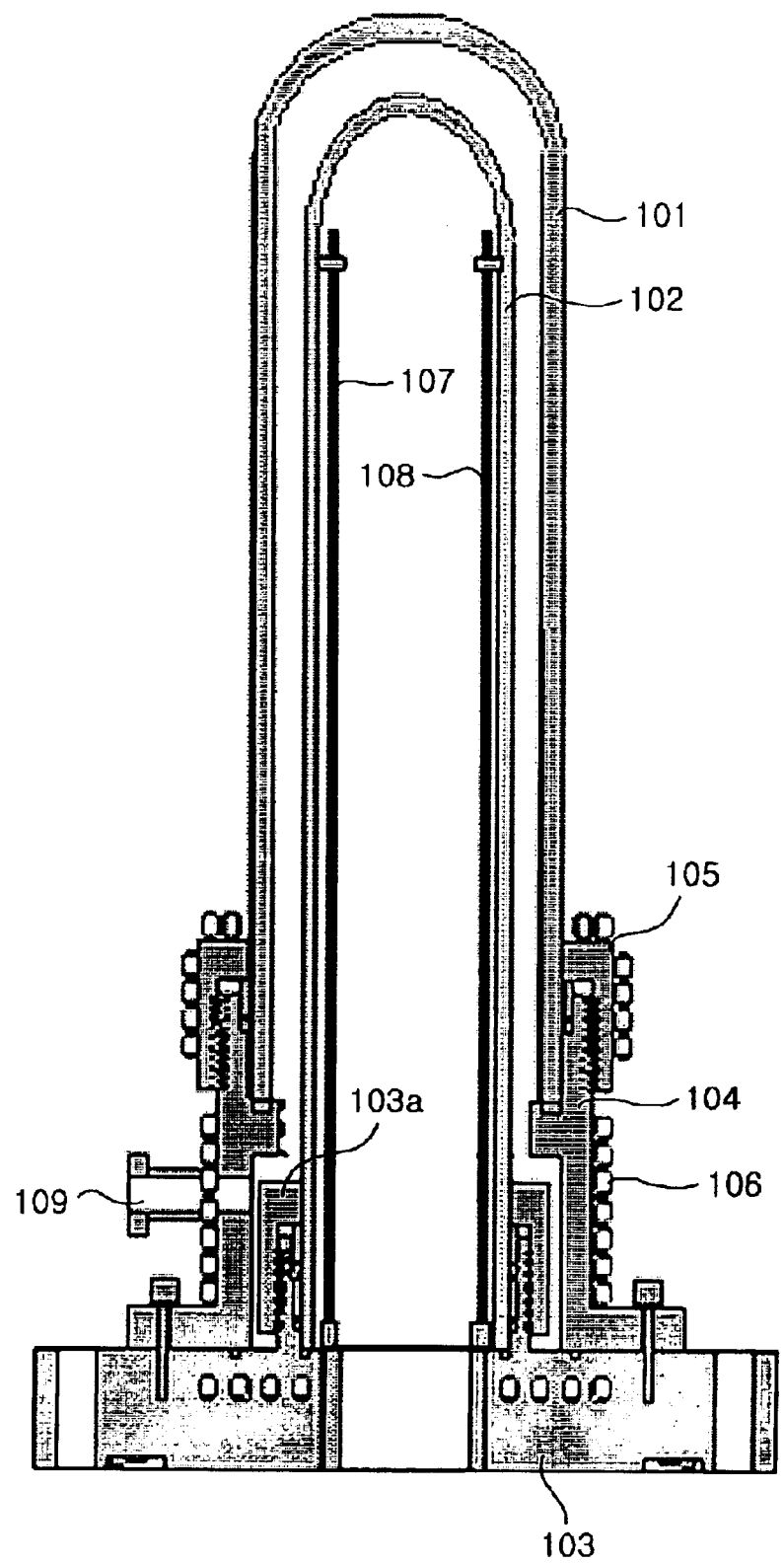
FIG. 6 sets forth a drawing for a growth chamber of a perpendicular-type ultra vacuum double quartz tube in the present invention.

FIGS. 4 and 5 represent a side view and an upper face view showing an apparatus for a perpendicular type ultra vacuum chemical vapor deposition in accordance with the present invention, and FIG. 6 is a drawing showing a double quartz tube in one embodiment of the invention.

As shown in FIGS. 4 and 5, a high vacuum chamber of the inventive apparatus for a perpendicular type ultra vacuum chemical vapor deposition is constructed by s a growth chamber 100 having a quartz tube of a heterostructure for maintaining a uniformity of an epitaxy growth under a high vacuum state and minimizing a thermal transfer from a wafer; a wafer transferring chamber 200 connected to a lower side of the growth chamber 100, for vertically transferring the wafer on which the epitaxy grows; a buffer chamber 300 equipped in a lower side of the wafer transferring chamber 200, for preventing a stress to a transfer gear caused by a pressure difference with the wafer transferring chamber 200 in vertically transferring the wafer; and a loadlock chamber 400 connected to one side of the wafer transferring chamber 200, for reducing a pollution from the outside in a growth of the epitaxy and discharging the wafer completed in the growth of the epitaxy to the outside.

Herewith, it is provided a three zone furnace 11 which wraps around an outer circumference face of the growth chamber 100 and in which a heater is stuck to on an inside face thereof so as to control temperature of the growth chamber 100, and a hoist 12 provided to exchange or easily cleansing a module of a quartz tube injected into the inside of the furnace 11, and a rotary handle 12a, are stuck to a side face of the furnace 11. This hoist 12 stuck to the side face of the furnace 11 is provided to simultaneously lift up the furnace 11 and the injected quartz tube module over 40 cm upwards, and the rotary handle 12a ensures a working space through its own incline to a side direction so that a maintenance and repair can be executed easily right now.

Like this, since the hoist 12 and the handle 12a for heating the growth chamber 100 is placed on a weight center part of the furnace 11, it is valid to rapidly and easily exchange and cleanse the growth chamber 100.

There are also contained a high vacuum chamber separating valve 13 for separating the growth chamber 100 from a high vacuum chamber, a turbo pump 14, 21 connected to one side of the wafer transferring chamber 200 and the load rock chamber 400, for supplying constant pressure, a wafer transfer chamber gate valve 15 for controlling pressure of the wafer transferring chamber 200, a load rock door 24 for loading and unloading the wafers from the load rock chamber 400, a wafer horizontal convey chain 401 having a driving motor 23 for horizontally conveying the wafers loaded and unloaded, a high vacuum chamber gate valve 22 for controlling pressure of the high vacuum chamber, a load rock chamber gate valve 20 for controlling pressure of the load rock chamber 400, and a vacuum gage 18 for sensing vacuum of the wafer transferring chamber 200, and further contained a vacuum chamber 16, 19, 32 for providing vacuum to the high vacuum chamber.

A front face part of the apparatus includes a computer 26 and a monitor 27 for monitoring an operational state of the apparatus, an interface box 25 for a control of the apparatus, a temperature control box 28 and a pressure control box 29, and further includes a hood 30 for protecting the apparatus and a partition 30a for separating the front face part from the high vacuum chamber.

Figure 7:
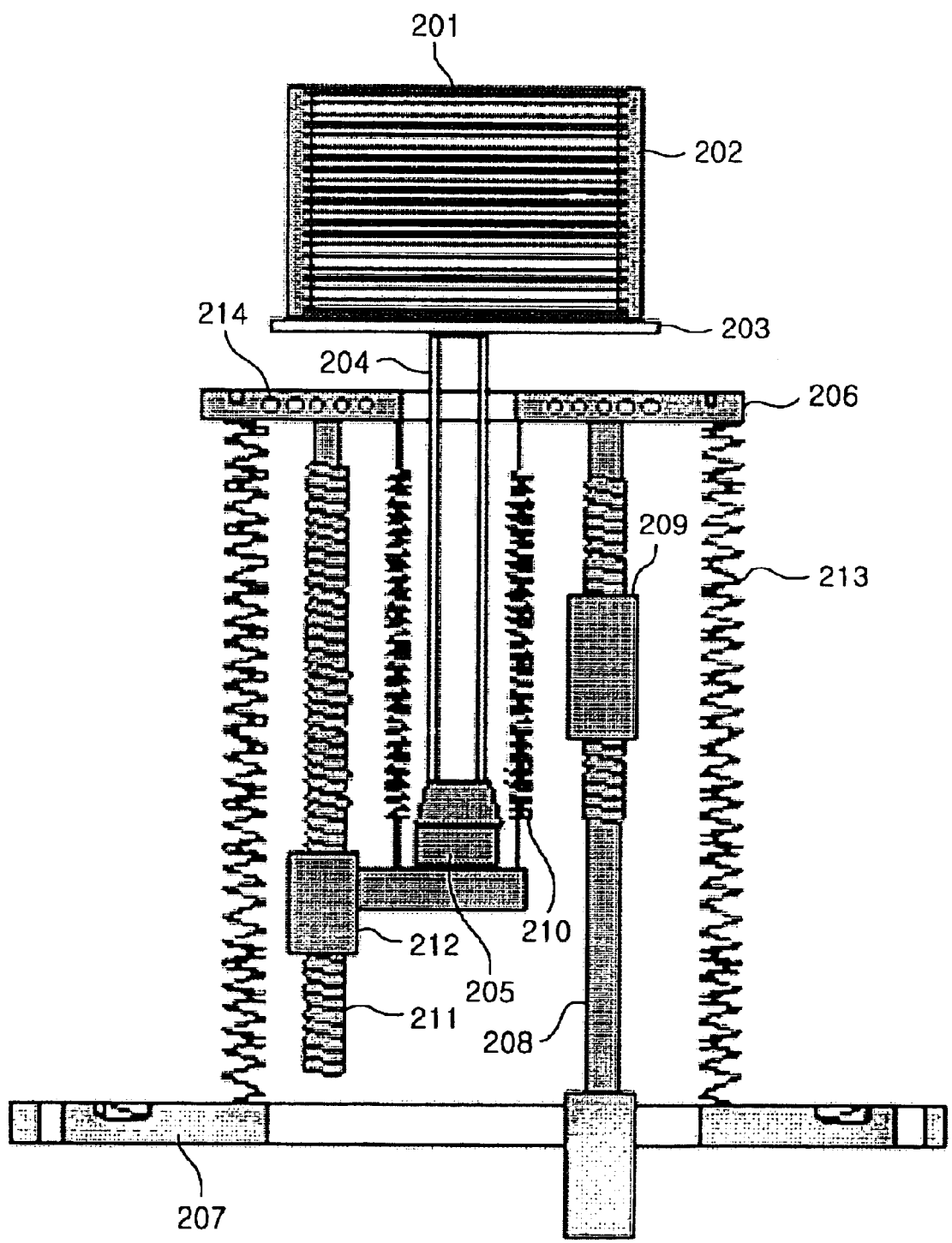
FIG. 7 indicates a drawing showing a perpendicular transfer device for use of a perpendicular-type ultra vacuum in the invention.

Describing in detail the growth chamber 100 constructing the high vacuum chamber referring to FIG. 6, the double quartz tube of the growth chamber 100 is composed of an inner quartz tube 102 having a support flange 103 in a lower part thereof, the inner quartz tube 102 being opened in a lower end part thereof; an outer quartz tube 101 supported to the support flange 103 of the inner quartz tube with a constant interval from the inner quartz tube 102, the outer quartz tube 101 having a support flange 104 in a lower part thereof and being opened in a lower end part thereof; a cooling water tube 106 equipped in an outer side of the support flange 104 of the outer quartz tube; a thermocouple 107 equipped along one side inner circumference face of the inner quartz tube 102 and a gas injecting part. 108 equipped along another side inner circumference face of the inner quartz tube 102; and a vacuum port 109 for providing vacuum by opening one side face of one side support flange 104 of the outer quartz tube 101, the thermocouple 107 and the gas injecting part 108 being connected to the support flange 103 of the inner quartz tube with a lower end part thereof, and a center part of the support flange 103 of the inner quartz tube having a formation of an opening aperture provided as an inlet and an outlet for loading and unloading wafer carriers 202 shown in FIG. 7.

Further, as shown in FIG. 4, a lowermost part of the heater stuck to the inner face of the furnace 11 is distanced with a constant interval from a lower end part of the outer quartz tube 101, and the support flange 104 of the outer quartz tube has a shape of "⊢". Therefore, it can be prevented a thermal stress concentrated to a corner of a connection part between the support flange 104 and an outer circumference face of the outer quartz tube 101, to thereby prevent a break of the outer quartz tube 101. The lower end part of the furnace 11 is closed with the outer circumference face of the outer quartz tube 101.

A gap between the outer quartz tube 101 and the inner quartz tube 102 is maintained as vacuum state of $10^{-3}$ torr, and a transfer of heat from the furnace 11 is cut off by a flow of the cooling water to the support flange 103, 104 and the cap 105 made of stainless steel. That is, since pressure of $10^{-3}$ torr and below prevents the transfer of heat, and temperature of the inner quartz tube 102 is increased by a heat emission through a little optical suction and by heat transferred from the wafer, the temperature in the inside of the growth chamber 100 is constantly maintained for a function of radius of the quartz tube.

As described above, the growth chamber 100 maintains a uniform temperature region of 30 cm or over by using the three zone furnace 11, and basic vacuum of $10^{-10}$ Torr and below is maintained by 1000 l/s turbo pump 31, and there are also equipped an automatic pressure control valve (not shown) for controlling pressure in the growth and an atomic mass analyzer (not shown) for monitoring oxygen, carbon or water vapor. It can be also used by charging the wafers based on a size of 4 to 8 inches in its diameter by 50 sheets or over and can grow under temperature of 400~1200° C. since its temperature range is very large.

Further, the growth chamber 100 is based on the structure of double quartz tube which has the outer quartz tube 101 and the inner quartz tube 102 made of quartz, thus its stableness for a use of an ultra vacuum in the vapor deposition apparatus can be heightened. What the quartz is used as material for the growth chamber 100 is why quartz of high purity can be gained easily and a pollution of the wafer can be prevented. In addition, since the quartz has a sufficient heat resistance and very lower thermal expansion coefficient against the outer quartz tube 101 of the apparatus for the low pressure chemical vapor deposition, a break due to the heat stress is not caused even though a temperature difference occurs between a portion of the outer quartz tube 101 installed within the furnace 11 and a portion of the outer quartz tube 101 installed in a lower part of the furnace. In addition, since the quartz has a low heat conductance, the temperature in the lower end part of the double quartz tube does not easily rise and it also easily provides a tight sealing state.

Figure 8:
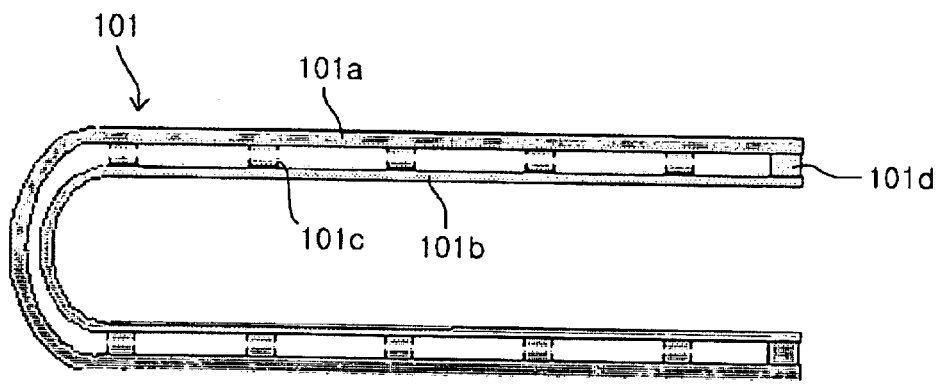
FIG. 8 is a drawing for a first embodiment of an outer quartz tube in accordance with the present invention.
Figure 9:
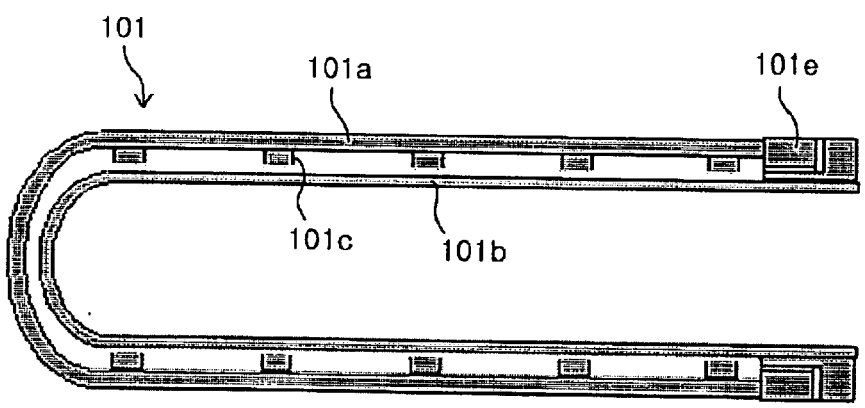
FIG. 9 is a drawing for a second embodiment of an outer quartz tube in the present invention.

As shown in FIGS. 8 and 9, the outer quartz tube 101 is made up of double quartz tubes 101a, 101b, and between two tubes, it is provided a structure of maintaining pressure of $10^{-6}$ torr. Since it is constructed by the double tubes, the outer quartz tube 101 can ensure a mechanical stableness from a stress caused due to a pressure difference, and can minimize the heat conduction through the quartz, whereby a problem of temperature unequally distributed in a diameter direction of the wafer is settled. Further, a temperature deviation over 15° C. may cause in the diameter direction owing to the heat conduction through the quartz tube in the high vacuum chamber, but such temperature deviation can be controlled so as to become 1° C. and below in the invention. That is, the epitaxy growth of a uniform thickness can be obtained in the high vacuum growth controlled by a surface reactive speed.

By using the double quartz tube, a phenomenon that the temperature rises and an out-gassing occurs by heat transferred to air and heater of the furnace 11 in the outer quartz tube 101 is cut off by the inner quartz tube 102 so as not to be transferred to the wafer.

Like this, the growth chamber 100 is based on a separation structure by using the high vacuum chamber separating valve 13, to thus maintain a conductance of a pumping in a high state and perform an isolation from the wafer transferring chamber 200 in the growth of the epitaxy.

Subsequently, the wafer transferring chamber 200 equipped in the lower side of the growth chamber 100 includes a wafer perpendicular transfer device 200a and a buffer chamber 300, wherein the wafer perpendicular transfer device 200a is, as shown in FIG. 7, made up of an upper flange 206 opened in a center thereof, for separating the growth chamber 100 and the wafer transferring chamber 200 during a growth of the epitaxy; a wafer carrier 202 accepting numerous wafers 201 and supported thereby; a quartz bottom plate 203 for supporting the wafer carrier 202; a wafer transfer die 204 connected to the quartz bottom plate 203, the wafer transfer die 204 having a guide 205 for supporting the wafer carrier 202 on which the wafers 201 are accumulated and vertically moving it; a lower flange 207 stuck to the buffer chamber 300 and opened in a center thereof; a primary convey die 208 having a primary transfer gear 209 and an outer bellows 213 connected between one side of the upper flange 206 and the buffer chamber 300, the outer bellows 213 being for upwards moving the upper flange 206; and a secondary convey die 211 which has a secondary transfer gear 212 connected to the guide 205 of the wafer transfer die 204 and has an inner bellows 210 connected between the upper flange 206 and the secondary transfer gear 212 so as to position the wafer carrier 202 vertically transferred by the primary convey die 208 at a uniform temperature region of the growth chamber 100, the inner bellows 210 being moved upwards by a rotation of the secondary transfer gear 212.

Herewith, the wafer transferring chamber 200 is provided with a thermocouple (not shown) stuck to an outside thereof, and the upper flange 206 separates the growth 100 from the wafer transferring chamber 200. High-temperature and high-vacuum double O-rings 214 are installed by forming flutes on the surface of the upper flange 206, to prevent a movement of the quartz tube causable by a pressure difference. The buffer chamber 300 prevents a stress to the gear which is caused by the pressure difference with the wafer transferring chamber 200 in vertically transferring the wafer carrier 202. The buffer chamber 300 is connected to a vacuum line of a rotary pump (not shown) so as to maintain $10^{-3}$ Torr.

Like this, the buffer chamber 300 is installed in a lower part of the wafer transferring chamber 200, and on its top, the wafer perpendicular transfer device 200a is stuck to, so that a resistance force by the pressure difference does not operate as a burden, namely, so as not to influence upon the primary and secondary transfer gears 209, 212. In case there is not such buffer chamber 300, it is needed a big motor for operating the perpendicular transfer device 200a, and an operational stableness is not easily ensured since a talk is caused largely in operation. Thus, braking devices 208, 211 are installed between the primary and secondary transfer gears 209, 212 and the upper flange 206 so that a serious stress is not affected upon the primary and secondary transfer gears 209, 212 by the pressure difference caused between the wafer transferring chamber 200 and the buffer chamber 300.

On an upper part of the perpendicular transfer device 200a having an operational function of a first stage and a second stage, which is installed within the wafer transferring chamber 200, the upper flange 206 is stuck onto, to separate the growth chamber 100 and the wafer transferring chamber 200 during a growth of the epitaxy. Herewith, the perpendicular transfer device 200a operates doubly so that the upper flange 206 can block a lower end port of the growth chamber 100 in a movement using a primary outer bellows 213, and then a secondary inner bellows 210 moves so that the wafer carrier 202 is reached a uniform temperature region of the growth chamber 100.

A separation between chambers can be gained by such transferring method, and a height of an overall system can be maintained in a low state by lessening a length of the transfer device. A mechanical operation for as table perpendicular movement of the wafer is also valid herein since the buffer chamber 300 is installed in the lower part of the wafer transferring chamber 200 thus the bellows 210, 213 operate in a high vacuum state.

The pressure of the buffer chamber 300 which makes the perpendicular transfer device 200a provided in the wafer transferring chamber 200, operable, is always monitored by a computer 26. In other words, in a case of an emergency state that the pressure of the buffer chamber 300 abnormally increase, a serial interlock recipe for protecting the perpendicular transfer device 200a is operated. Such safety function stably protects the perpendicular transfer device 200a by using a micro-switch so as to protect it doubly even under a down state of a computer 26. Further, under a state that the perpendicular transfer device 200a operates and the wafer 201 enters the growth chamber 100, the safety device is set so that the wafer transfer chamber gate valve 15 never operates, to thus perfectly eliminate a possibility of shock in a wafer cassette.

The loadlock chamber 400 as an entrance part of the high vacuum chamber includes a high vacuum chamber gate valve 22 for controlling vacuum of the high vacuum chamber, a turbo pump 21 of 160 l/s for providing the vacuum to the loadlock chamber 400, a loadlock chamber gate valve 20 for controlling the vacuum of the loadlock chamber 400, a view port 33 for monitoring a state of the loadlock chamber, a loadlock door 24 which is opened and closed so as to charge the wafer, and a wafer horizontal convey chain 24 having a driving motor 23 for horizontally conveying the wafer 201 charged into the loadlock chamber 400, and herewith there are also installed a Pirani gauge (not shown) and a cold cathode ion gauge (not shown) etc.

Like this, an overall systematic length can be reduced and a pollution from the outside can be lessened at maximum, by the wafer horizontal convey chain 24 installed in the inside of the loadlock chamber 400.

In a front face part of the apparatus, there are equipped the computer 26 and the monitor 27 for controlling an overall system, the interface box 25 for connecting the computer 26 with instruments and components, the temperature control box 28, and the pressure control box 29, to monitor a state of the system in operating the system and perform a suitable deposition in an occurrence case of an emergent state.

Also, a liquid nitrogen shroud 17 is set in the inside of the wafer transferring chamber 200, to execute an out-gassing so as to increase temperature of the growth chamber 100 to a high temperature state and discharge gas to the outside, that is, the liquid nitrogen shroud 17 is used in getting the basic vacuum $10^{-9}$ Torr, and in addition, is operated before opening the wafer transfer chamber gate valve 15 in order to convey the wafer 201 to the growth chamber 100 and to thereby trap impurity gas injected together with the conveyance of the wafer and the carrier 202, and so heighten a purity of the growing epitaxy at maximum.

As the turbo pump 14, 21, 31, it is used the pump using a magnetic force having a high resistance against a collision, an erosion and a corrosion so as not to transfer a vibration. A liquid nitrogen trap (not shown) is installed between the growth chamber 100 and the turbo pump 31, to prevent pollution owing to a reverse flow.

Further, a draft or ventilating tube (not shown) is installed on an upper part of the furnace 11 heating the growth chamber 100 to circulate air in an flow of 500 m³/h or over, and a system for preventing a danger by a gas leakage is driven by monitoring hydrogen gas and toxic gas such as phosphine or arsine gas and connecting it through an interlock function.

Meanwhile, pressure of the buffer chamber 300 and the growth chamber 100 is always monitored through the computer 26, thus a serial interlock function of protecting the chamber is provided in a case of an emergent state that the pressure of the buffer chamber 300 is increased abnormally. Such safety function is operated doubly by using the microswitch so that the chamber may maintain an ultra vacuum and ultra-clean state and is protected even under a state that the computer 26 does not operate. Particularly, a productivity is heightened by constructing the vacuum system so as to gain such clean environment of the chamber in reproducibility in a short time within 5 minutes from a charging of the wafer to a beginning of the growth.

All portions connected by the buffer chamber 300 and the wafer transferring chamber 200 and the loadlock chamber 400 are made of stainless steel, and on the outside of all the chambers, a radiating belt and a constant-temperature die are installed to enable to increase the temperature to 250° C. Such radiating device is used in a thermal anneal process to get the basic vacuum by initially operating the system.

FIGS. 8 and 9 are drawings showing the outer quartz tube in the preferred embodiment of the present invention. FIG. 8 represents the structure of the outer quartz tube which is completely sealed, and FIG. 9 indicates the structure of continuously maintaining the vacuum so as to eliminate gas occurring by a continuous pumping and out-gassing in its use procedure.

Herewith, the outer quartz tube 101 is provided as a double tube 101a, 101b tightly closed in a lower end thereof, and support dies 101c made of quartz are disposed with a constant interval in the inside of the double tube to heighten a mechanical stableness. The double tube 101a, 101b is provided in a thin state as possible to minimize a problem of an unbalanced heat emission. An unexplained reference number '101e' indicates a vacuum port same as the vacuum port 109 of the FIG. 6.

Figure 10:
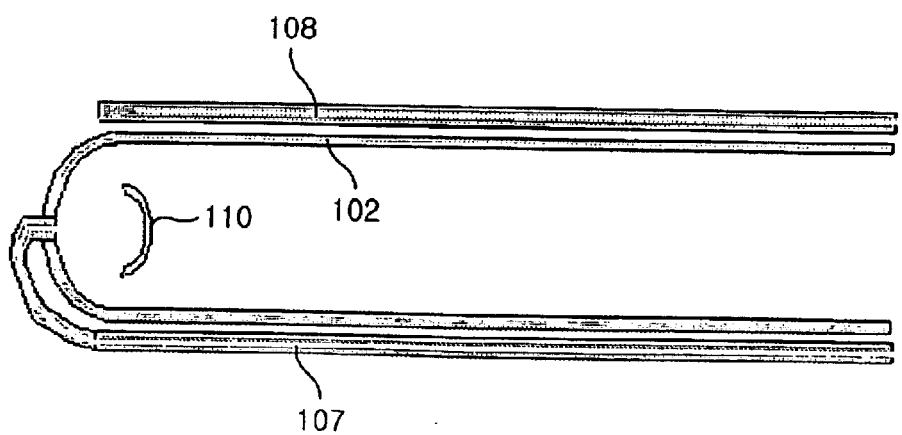
FIG. 10 furnishes a drawing showing an inner quartz tube which is provided with a thermocouple and a gas supply line installed on the outside thereof in the invention.

FIG. 10 shows an example of a structure in which the thermocouple 107 and the gas injection aperture 108 are stuck to the outside of the inner quartz tube 102, and this structure is profitable in a vertical movement of the wafer in comparison with the structure of a sticking to the inside of FIG. 6 and can prevent phenomena that the epitaxy grows on an edge of the wafer partially and unequally or small particles are caused. Such inner chamber separately positions a small tube having an injection of gas at an outside of the inner quartz tube 102, thus it is profitable in an aspect of the structure to maintain and use the growth chamber 100 as the ultra vacuum 100. Herewith, an undescribed reference number '110' is a diffuser.

As described above, the inventive apparatus for the perpendicular type ultra vacuum chemical vapor deposition is based on the perpendicular type structure.

Subsequently, it is described in the following, an epitaxy thin film growing method through a use of the inventive apparatus for a perpendicular type ultra vacuum chemical vapor deposition.

In the perpendicular type ultra vacuum CVD apparatus, it is the method of vapor-depositing a doping silicon thin film based on a real time high consistency on a 5 inches p-type silicon <100> wafer. That is, before a charging of the wafer, the wafer is continuously cleansed in 4:1 $H_2SO_4/H_2O_2$ solution and 100:1 $H_2O/HF$ solution.

Then, the wafer 201 is charged into the loadlock chamber 400 to gain pressure of $10^{-6}$ torr and below by using the turbo pump 21, after that, the loadlock chamber gate valve 20 is opened to move the wafer 201 to the wafer transferring chamber 200 by using the wafer convey chain 401. At this time, it is very clean state since the wafer transferring chamber 200 is always maintained in the pressure under $10^{-8}$ torr. Next, the wafer 201 is stood by in the wafer transferring chamber 200 for about 1 minute and simultaneously pumps gas injected in the loadlock chamber 400. At the same time, a flow quantity of hydrogen gas is controlled in the growth chamber 100 to lower the pressure to $10^{-4}$ torr or over, thereby a quantity of outside gas entering the chamber is minimized during a movement period of the wafer.

Subsequently, when the pressure of the growth camber 100 is stabilized, the high vacuum chamber gate valve 22 is opened, the wafer perpendicular transfer device 200a is driven, the upper flange 206 supporting the wafer is in contact with a wall of the growth chamber 100 so as to be isolated from the wafer transferring chamber 200. And then, a flow quantity of the hydrogen injected into the growth chamber 100 is increased to heighten the pressure of the growth chamber 100 to about $10^{-3}$ torr, slowly lift up upwards the inner belows 210 having a sticking of the wafer transfer die 204, and then move the wafer 201 to the growth region where the temperature is uniform. At this time, since the temperature of the growth chamber 100 is highly maintained over 450° C., the hydrogen is thermal-analyzed during a surface anneal of the wafer 201, to thereby expose original silicon atom. When the oxide film of the wafer 201 surface is sufficiently removed and the temperature of the wafer 201 becomes uniform completely, the gas pressure of the growth chamber 100 inside is controlled as pressure of 0.1~100 mtorr necessary for the growth, and simultaneously reactive gas of $SiH_4$, $Si_2H_6$, $Si_2H_2Cl_2$, $GeH_4$, $B_2H_6$, $PH_3$, $CH_4$ and $AsH_3$ flows through the gas injecting aperture 108 and the growth starts. Herewith, the structure of the gas supply line is designed so as to be proper to its use after such procedures that this reactive gas valve is opened and a flowing procedure based on conditions caught previously for 1 minute or over is progressed so as to sufficiently dilute and be stabilized before the gas injection to the growth chamber 100. When the growth of the epitaxy is completed, the hydrogen gas flows to purge the growth chamber 100 so as to stop the growth, the pressure is lowered to $10^{-7}$ torr and below, the wafer perpendicular transfer device 200a is driven to move the wafer 201 to the wafer transferring chamber 200, and after that, the wafer transfer chamber gate valve 15 is closed. Subsequently, the wafer 201 is moved to the loadlock chamber 400 by using the wafer convey chain 401, then the wafer 201 is taken out through the loadlock door 24, whereby the growth is completed.

As afore-mentioned, in accordance with the present invention, in an apparatus for a perpendicular type ultra vacuum chemical vapor deposition, a thin film based on a high quality can be grown under a low temperature and a low pressure of 500° C. and Torr, and the growth can be obtained by disposing the wafers by 50 pieces or over at one time. Therefore, there is an effect enough to sufficiently heighten productivity. In addition, there is a profitable effect in a growth based on an atomic unit under the low temperature or in a two-dimensional doping with impurity of a high consistency or in manufacturing a 2 DEG quantization effect device, by lessening contains of oxygen or carbon to be injected, in a basic vacuum of $10^{-10}$ Torr.

Further, a width of a doping consistency can be controlled so as to become narrow and keen on a wafer having a formation of a pattern through a control of an epitaxy growth with an exact thickness, composition and consistency, accordingly, there is an effect of usefully utilizing the invention in the next generation extreme-minute silicon semiconductor or in a quantization device manufacture process by striving for a high-integration of a device.

Additionally, a high electron movement extent of $8 \times 10^5$ cm$^2$/V sec can be gained under 10 K by controlling a distribution of atom within 3 nm on a surface of an Si/SiGe hetero device, and properties of matter necessary for a manufacture of an HFET having a high-speed operational characteristic based on 300 GHz or over can be provided, and also a function of growing a self-aligned selective epitaxy under the low temperature is provided.

It will be apparent to those skilled in the art that various modifications and variations can be made in the present invention without deviating from the spirit or scope of the invention. Thus, it is intended that the present invention cover the modifications and variations of this invention provided they come within the scope of the appended claims and their equivalents.

What is claimed is:

1. An apparatus for a low-pressure chemical vapor deposition comprising:
   a growth chamber having a quartz tube of a heterostructure for maintaining a uniformity in a growth of an epitaxial layer under a high vacuum and minimizing a thermal transfer from a wafer;
   a wafer transferring chamber connected to a lower side of the growth chamber, said wafer transferring chamber having a perpendicular transfer device for vertically transferring the wafer on which the epitaxial layer grows;
   a buffer chamber equipped in a lower side of the wafer transferring chamber, for preventing a stress to a transfer gear caused by a pressure difference with the wafer transferring chamber in vertically transferring the wafer; and
   a loadlock chamber connected to one side of the wafer transferring chamber, for reducing a pollution from the outside in the growth of the epitaxial layer, horizontally transferring the wafer completed in the growth of the epitaxial layer, and discharging it to the outside,
   wherein said perpendicular transfer device within the wafer transferring chamber, comprises:
      an upper flange opened in a center thereof, for separating the growth chamber and the wafer transferring chamber during the growth of the epitaxial layer;
      a wafer carrier accepting numerous wafers and supporting the accepted wafers;
      a quartz bottom plate for supporting the wafer carrier;
      a wafer transfer die connected to the quartz bottom plate, for supporting the wafer carrier on which then wafers are accumulated, and vertically moving it;
      a lower flange stuck to the buffer chamber an opened in a center thereof;
      a primary convey die having a primary transfer gear and an outer bellows connected between one side of the upper flange and the buffer chamber, said outer bellows being for upwards moving the upper flange; and
      a secondary convey die which has a secondary transfer gear connected to the wafer transfer die and has an inner bellows connected between the upper flange and the secondary transfer gear so as to position the wafer carrier vertically transferred by the primary convey die at a uniform temperature region of the growth chamber, said inner bellows being moved upwards by a rotation of the secondary transfer gear.

2. The apparatus of claim 1, wherein said quartz tube of said heterostructure comprises:
   an inner quartz tube having a support flange in a lower part thereof, said inner quartz tube being opened in a lower end part thereof;
   an outer quartz tube supported to the support flange of the inner quartz tube with a constant interval from the inner quartz tube, said outer quartz tube having a support flange in a lower part thereof and being opened in a lower end part thereof;
   a cooling water tube equipped in an outer side of the support flange of the outer quartz tube, for preventing a heat transfer transferred to the outer quartz tube;
   a thermocouple equipped along one side inner circumference face of the inner quartz tube and a gas injecting part equipped along another side inner circumference face of the inner quartz tube; and
   a vacuum port for providing vacuum by opening one side face of one side support flange of the outer quartz tube,
   said thermocouple and said gas injecting part being connected to the support flange of the inner quartz tube with a lower end part thereof, and a center part of said support flange of the inner quartz tube having a formation of an opening aperture provided as an inlet and an outlet for loading and unloading the wafer.

3. The apparatus of claim 2, wherein a gap between said outer quartz tube and said inner quartz tube is maintained under pressure of $10^{-3}$ Torr.

4. The apparatus of claim 2, wherein said outer quartz tube is constructed by double tube maintained under the pressure of $10^{-65}$ Torr.

5. The apparatus of claim 4, wherein said double tube further comprises a quartz support die disposed with a constant interval in the inside of the double tube, said quartz support die being for preventing an unbalanced heat emission.

6. The apparatus of claim 1, wherein said growth chamber includes:
   a furnace which wraps around an outer circumference face of the outer quartz tube and in which a heater is stuck to on an inside face thereof so as to control temperature of the growth chamber;
   a hoist and a rotary handle stuck to a side face of the furnace and provided so as to easily exchange and cleanse a module of the double quartz tube injected into the inside of the furnace; and
   a ventilating tube equipped on an upper part of the furnace, for circulating air,
   said hoist being provided to simultaneously lift up the furnace and the injected quartz tube module, and said rotary handle being for ensuring a working space through its own incline to a side direction so that a maintenance and repair can be executed easily.

7. The apparatus of claim 1, wherein said upper flange has double O-ring installed to prevent the quartz tube from being moved owing to the pressure difference between the outer quartz tube and the inner quartz tube.

8. The apparatus of claim 1, wherein said wafer transferring chamber further comprises a liquid nitrogen shroud set in the inside thereof and provided to increase the temperature of the growth chamber to a high temperature state and maintain a basic vacuum of $10^{-9} \sim 10^{-10}$ Torr.

9. The apparatus of claim 1, wherein each portion for connecting said wafer transferring chamber, the buffer chamber and the loadlock chamber is made of stainless steel, and the wafer transferring chamber, the buffer chamber and the loadlock chamber are provided with a radiating belt and a constant-temperature die formed on the outside thereof.

10. The apparatus of claim 1, further comprising a turbo pump for providing the growth chamber with the pressure of $10^{-9} \sim 10^{-10}$ Torr.

11. The apparatus of claim 10, wherein said growth chamber and said turbo pump are provided with a liquid hydrogen trap set between them, said liquid hydrogen trap being for preventing a pollution caused by a reverse-directional flow.

12. The apparatus of claim 1, wherein said buffer chamber is connected to a rotary pump so as to maintain the pressure of $10^{-3}$ Torr.

13. An apparatus for a low-pressure chemical vapor deposition, comprising:
   a growth chamber of a double-tube structure having an outer quartz tube and an inner quartz tube for a growth of an epitaxy;
   an upper flange stuck to a lower side of the growth chamber during the growth of the epitaxy, and opened in a center thereof;
   a wafer carrier accepting numerous wafers and supported thereby;
   a quartz bottom plate for supporting the wafer carrier;
   a wafer transfer die connected to the quartz bottom plate, for supporting the wafer carrier on which the wafers are accumulated, and vertically moving it;
   a buffer chamber for preventing a stress caused by a pressure difference with the growth chamber during a vertical transfer of the wafer transfer die;
   a lower flange stuck to the buffer chamber and opened in a center thereof;
   a primary convey die having a primary transfer gear and an outer bellows connected between one side of the upper flange and the buffer chamber, said outer bellows being for upwards moving the upper flange; and
   a secondary convey die which as a secondary transfer gear connected to the wafer transfer die and has an inner bellows connected between the upper flange and the secondary transfer gear so as to position the wafer carrier vertically transferred by the primary convey die at a uniform temperature region of the growth chamber, said inner bellows being moved upwards by a rotation of the secondary transfer gear.

* * * * *